(12) United States Patent
Chen

(10) Patent No.: US 12,513,383 B2
(45) Date of Patent: Dec. 30, 2025

(54) ELECTRONIC DEVICE

(71) Applicant: Chicony Electronics Co., Ltd., New Taipei (TW)

(72) Inventor: Hsin Hung Chen, New Taipei (TW)

(73) Assignee: Chicony Electronics Co., Ltd., New Taipei (TW)

( * ) Notice: Subject to any disclaimer, the term of this patent is extended or adjusted under 35 U.S.C. 154(b) by 72 days.

(21) Appl. No.: 18/601,990

(22) Filed: Mar. 11, 2024

(65) Prior Publication Data

US 2025/0080819 A1     Mar. 6, 2025

(30) Foreign Application Priority Data

Sep. 5, 2023    (TW) .................................. 112133631

(51) Int. Cl.
| | |
|---|---|
| *H04N 23/55* | (2023.01) |
| *H01L 25/075* | (2006.01) |
| *H04N 23/51* | (2023.01) |
| *H10H 20/856* | (2025.01) |

(52) U.S. Cl.
CPC ......... *H04N 23/55* (2023.01); *H01L 25/0753* (2013.01); *H04N 23/51* (2023.01); *H10H 20/856* (2025.01)

(58) Field of Classification Search
CPC ..... H04N 23/56; H04N 23/55; H01L 25/0753
USPC ....................................................... 348/335
See application file for complete search history.

(56) References Cited

U.S. PATENT DOCUMENTS

| | | |
|---|---|---|
| 8,382,351 B2 | 2/2013 | Ishikawa et al. |
| 8,740,427 B2 | 6/2014 | Fritz et al. |
| 2013/0162775 A1* | 6/2013 | Baumann ............... A61B 5/065 |
| | | 348/45 |
| 2019/0208095 A1* | 7/2019 | Kraz ..................... G02B 6/0068 |
| 2020/0142263 A1* | 5/2020 | Toko ................. G02F 1/136286 |
| 2021/0096353 A1* | 4/2021 | Murayama ........... G02B 23/243 |
| 2021/0328391 A1* | 10/2021 | Hofmann ............. H01R 13/506 |
| 2022/0341559 A1* | 10/2022 | Toko ..................... F21S 41/153 |
| 2022/0348133 A1* | 11/2022 | Lee ......................... F21S 43/27 |

(Continued)

FOREIGN PATENT DOCUMENTS

| | | |
|---|---|---|
| CN | 102147090 | 8/2011 |
| CN | 102563538 | 7/2012 |

OTHER PUBLICATIONS

"Office Action of Taiwan Counterpart Application", issued on May 21, 2024, p. 1-p. 7.

*Primary Examiner* — Lin Ye
(74) *Attorney, Agent, or Firm* — JCIPRNET

(57) ABSTRACT

An electronic device includes a housing and a state indication light. The state indication light is assembled to the housing and includes a light-guiding structure and multiple light-emitting elements. The light-guiding structure has an incident plane, a reflection plane and an exit plane. The reflection plane is inclined to the incident plane and the exit plane. The light-emitting elements are disposed on a side of the light-guiding structure and face the incident plane. A light beam emitted by each of the light-emitting elements is adapted to enter the light-guiding structure from the incident plane and arrive at the reflection plane. The reflection plane is adapted to reflect the light beam towards the exit plane so that the light beam is directed from the exit plane to an outside of the light-guiding structure.

20 Claims, 7 Drawing Sheets

(56) References Cited

U.S. PATENT DOCUMENTS

| 2023/0242180 A1* | 8/2023 | Kojima | B62D 1/04 |
| | | | 362/511 |
| 2023/0280609 A1* | 9/2023 | Ichihara | G02F 1/133615 |
| | | | 349/58 |

* cited by examiner

ELECTRONIC DEVICE

CROSS-REFERENCE TO RELATED APPLICATION

This application claims the priority benefit of Taiwan application serial no. 112133631, filed on Sep. 5, 2023. The entirety of the above-mentioned patent application is hereby incorporated by reference herein and made a part of this specification.

BACKGROUND

Technical Field

The disclosure relates to an electronic device, and in particular to an electronic device that may emit light.

Description of Related Art

Some electronic devices on the market have a light-emitting effect, and light-emitting elements thereof such as light-emitting diodes are disposed in the recesses of the light-guiding structures inside the devices to reduce the loss of light intensity. However, such a design causes light to be concentrated in the recesses, which causes the exit plane of the electronic device to easily produce lamp beads or light segmentation, and makes the overall brightness of the exit plane uneven. In other electronic devices, light-emitting elements are disposed on the end planes of the light-guiding structures. However, such a design causes light to be concentrated on the local light-emitting plane in the opposite direction of the light-emitting elements, which also creates the problem of uneven overall brightness.

SUMMARY

The disclosure provides an electronic device, which has uniform luminous brightness.

An electronic device of the disclosure includes a housing and a state indication light. The state indication light is assembled to the housing and includes a light-guiding structure and multiple light-emitting elements. The light-guiding structure has an incident plane, a reflection plane and an exit plane. The reflection plane is inclined to the incident plane and the exit plane. The light-emitting elements are disposed on a side of the light-guiding structure and face the incident plane. A light beam emitted by each of the light-emitting elements is adapted to enter the light-guiding structure from the incident plane and arrive at the reflection plane. The reflection plane is adapted to reflect the light beam towards the exit plane so that the light beam is directed from the exit plane to an outside of the light-guiding structure.

In an embodiment of the disclosure, spacing exists between each of the above-mentioned light-emitting elements and the incident plane.

In an embodiment of the disclosure, the above-mentioned light-guiding structure is in an L shape.

In an embodiment of the disclosure, the above-mentioned reflection plane overlaps the incident plane in a direction perpendicular to the incident plane.

In an embodiment of the disclosure, an included angle between the above-mentioned reflection plane and the incident plane is less than 45 degrees.

In an embodiment of the disclosure, the above-mentioned light-guiding structure is adapted for assembly to the housing from an outside of the housing, and the exit plane is flush with an appearance surface of the housing.

In an embodiment of the disclosure, an appearance surface of the above-mentioned light-guiding structure is the exit plane, and the exit plane has an etching pattern.

In an embodiment of the disclosure, the above-mentioned light-guiding structure includes a main body portion and an extension portion. The extension portion extends from the main body portion towards an outside of the electronic device, the incident plane and the reflection plane are located on the main body portion, and the exit plane is located on the extension portion.

In an embodiment of the disclosure, the above-mentioned extension portion does not overlap the light-emitting elements in a direction perpendicular to the incident plane.

In an embodiment of the disclosure, the above-mentioned extension portion protrudes relative to the main body portion in a direction parallel to the exit plane.

In an embodiment of the disclosure, the above-mentioned light-guiding structure includes a main body portion and at least one hook portion that are connected to each other, and the at least one hook portion is engaged with the housing.

In an embodiment of the disclosure, the above-mentioned at least one hook portion is integrally formed and connected to the main body portion.

In an embodiment of the disclosure, the above-mentioned light-guiding structure is doped with titanium dioxide particles.

In an embodiment of the disclosure, the above-mentioned state indication light further includes a frame body. The light-guiding structure and the light-emitting elements are disposed on the frame body.

In an embodiment of the disclosure, the above-mentioned electronic device is a camera device and further includes a lens. The frame body is located between the light-emitting elements and the lens.

In an embodiment of the disclosure, the above-mentioned frame body defines a recess portion. The light-guiding structure and the light-emitting elements are located in the recess portion, and the recess portion and the lens are located on opposite sides of the frame body.

In an embodiment of the disclosure, the above-mentioned state indication light further includes a flexible circuit board and a reinforcement board. The light-emitting elements are disposed on the flexible circuit board, and the flexible circuit board is stacked on the reinforcement board.

In an embodiment of the disclosure, the above-mentioned state indication light further includes a reflective layer. The reflective layer is disposed on the reflection plane.

In an embodiment of the disclosure, the above-mentioned electronic device has a main functional area. The main functional area and the exit plane are located on different sides of the housing.

In an embodiment of the disclosure, the above-mentioned electronic device is a camera device, and the main functional area is a camera area.

Based on the above, the light-emitting element of the state indication light of the disclosure is disposed on a side of the light-guiding structure corresponding to the incident plane of the light-guiding structure, so that the light beam emitted by the light-emitting element enters the light-guiding structure from the incident plane of the light-guiding structure and arrives at the inclined reflection plane, thereby being reflected by the reflection plane towards the exit plane, and directed from the exit plane to the outside of the light-guiding structure. In this way, the light beam emitted by each of the light-emitting elements does not directly illuminate the exit plane, thereby avoiding the phenomenon of light segmentation on the exit plane. Moreover, under the configuration of the disclosure, as long as the extension range of the incident plane and the reflection plane is large enough, the number and arrangement range of the light-emitting elements may be sufficient to cover the range of the exit plane without causing the brightness to be concentrated merely in a local area of the exit plane. Therefore, the electronic device of the disclosure may achieve the effect of uniform lighting of the state indication light.

DESCRIPTION OF THE EMBODIMENTS

Figure 1A:
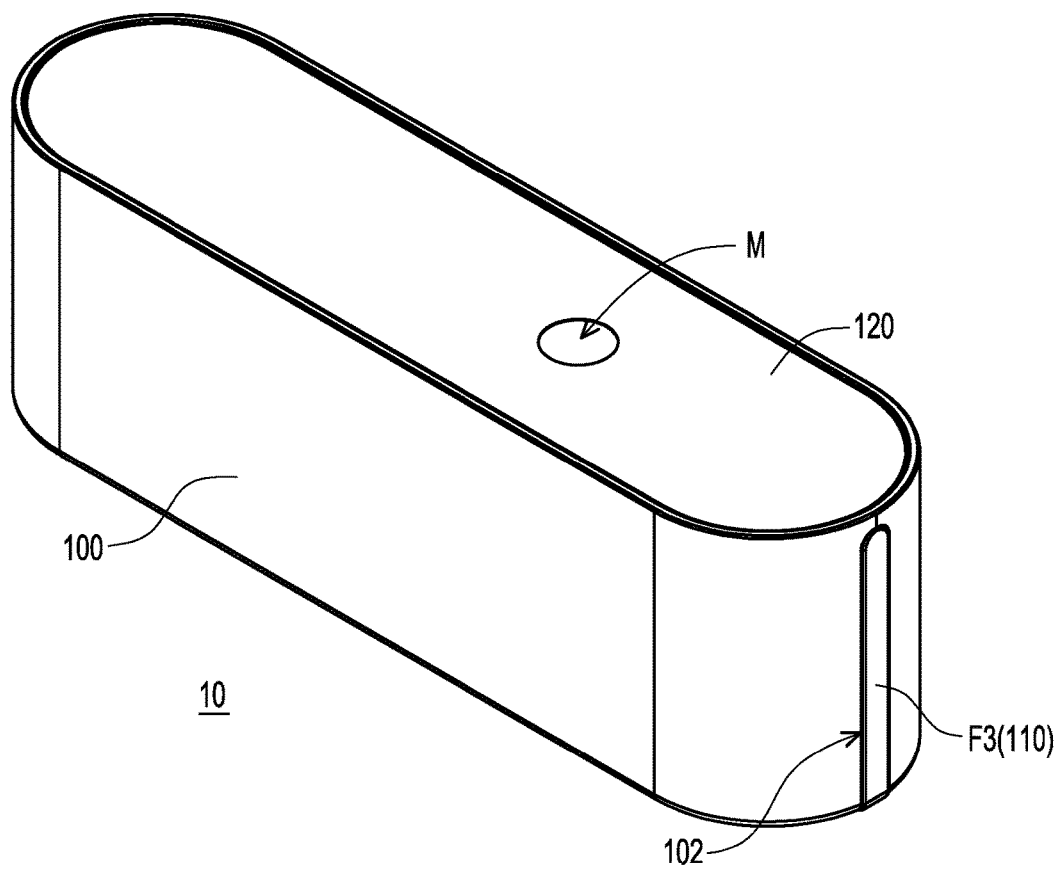
FIG. 1A is a perspective view of an electronic device according to an embodiment of the disclosure.

For the convenience and clarity of description, the thickness or size of each element in the drawings is exaggerated, omitted or schematically expressed to facilitate the understanding and reading of those familiar with this art. Moreover, the size of each element is not entirely the actual size, and is not used to limit the conditions for the implementation of the disclosure, thereby having no technical substantive significance. Any structural modifications, changes in proportions, or adjustments in size that will not affect the effects that the disclosure can produce, and the purpose that can be achieved should still fall within the scope of the technical content disclosed in the disclosure. The same reference numbers will be used throughout the drawings to refer to the same or similar elements.

Figure 1B:
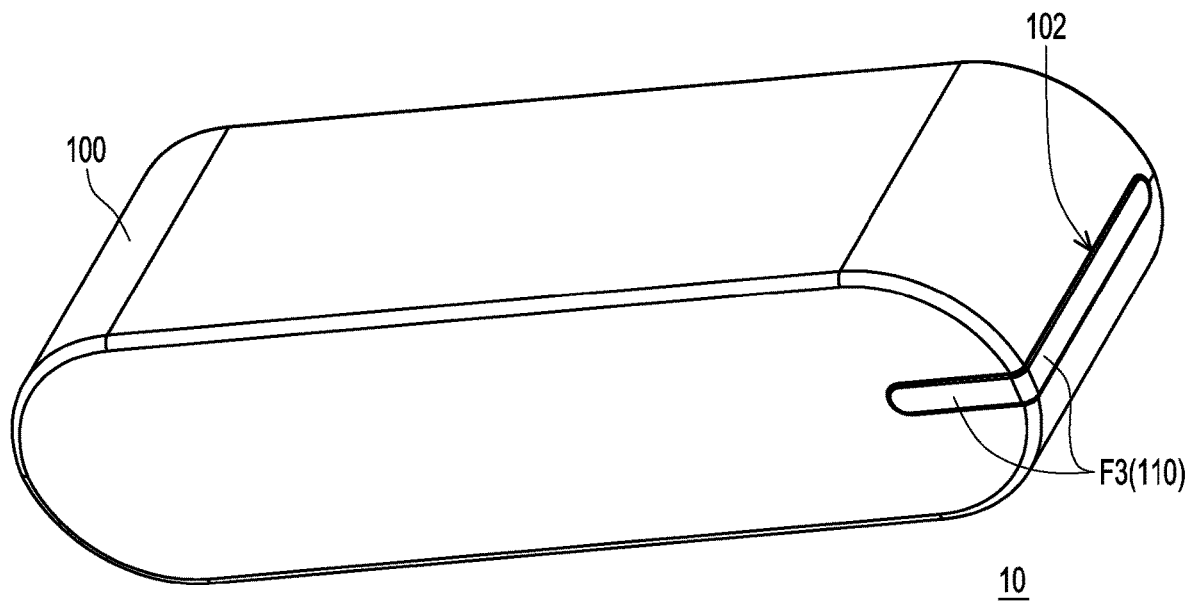
FIG. 1B is another perspective view of the electronic device of FIG. 1A.

FIG. 1A is a perspective view of an electronic device according to an embodiment of the disclosure. FIG. 1B is another perspective view of the electronic device of FIG. 1A. Referring to FIGS. 1A and 1B, an electronic device 10 of the embodiment is, for example, a Web Cam or other types of camera devices and has a main functional area M. The main functional area M is, for example, a camera area, which is configured to capture an external image, but the type of the electronic device 10 is not limited thereto. The electronic device 10 includes a housing 100 and a state indication light 110. The state indication light 110 is assembled to the housing 100 so that the electronic device 10 may display the current use state of the electronic device 10 through the state indication light 110.

Figure 2A:
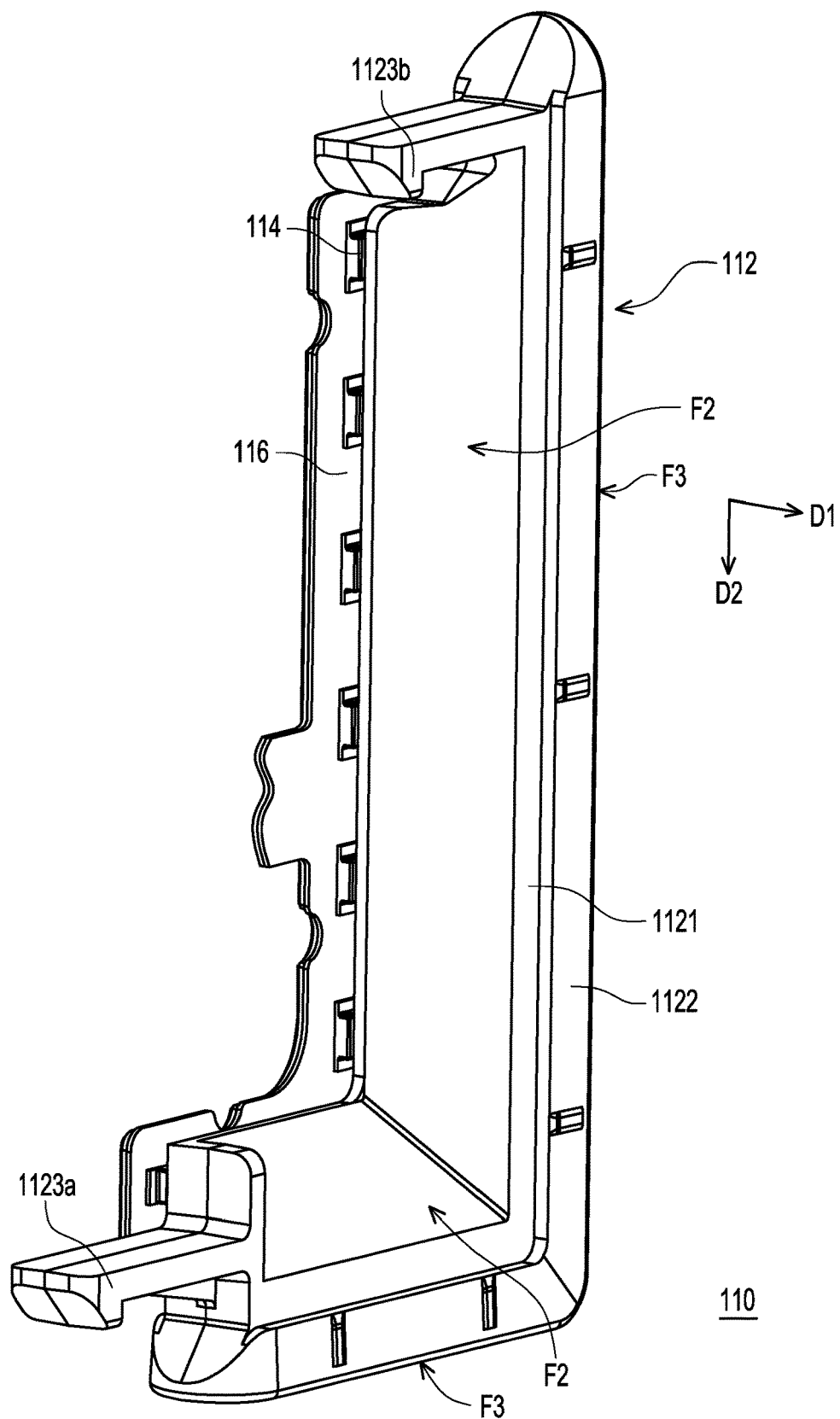
FIG. 2A is a perspective view of some components of the state indication light in FIG. 1A.
Figure 2B:
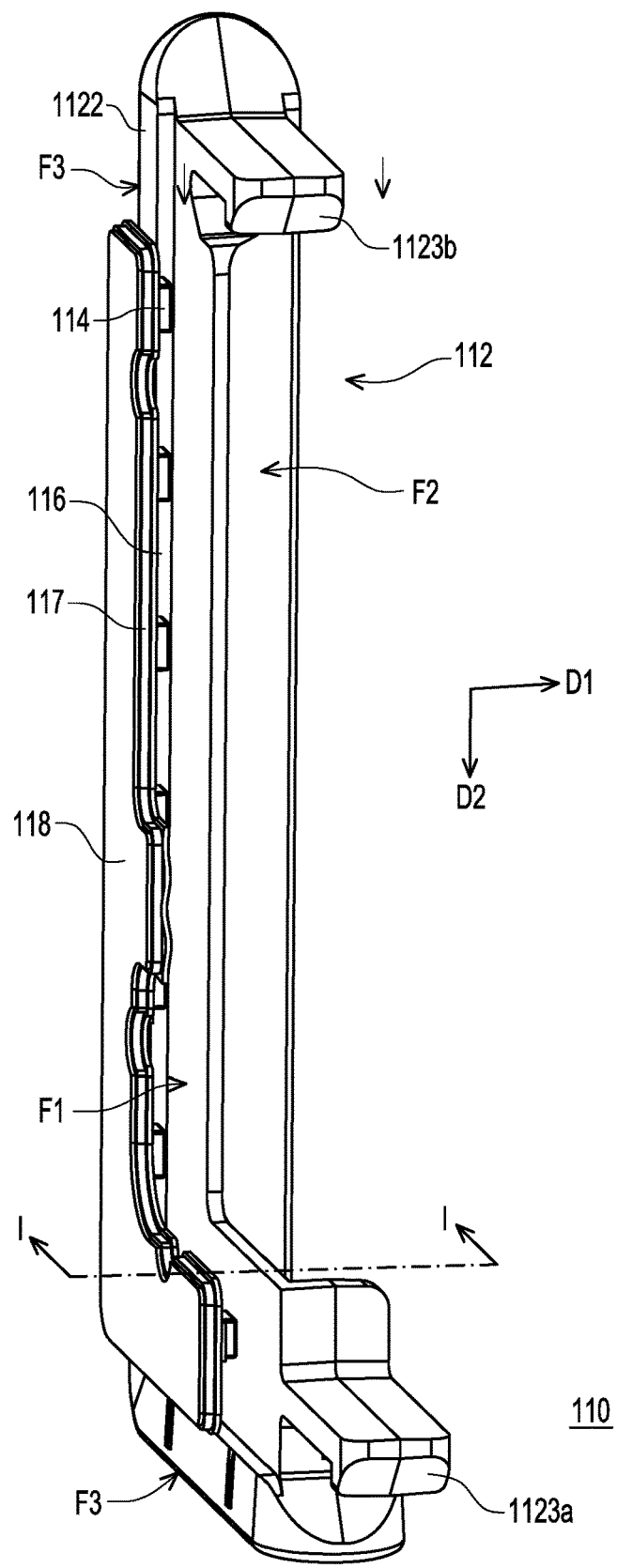
FIG. 2B is another perspective view of some components of the state indication light in FIG. 2A.
Figure 3:
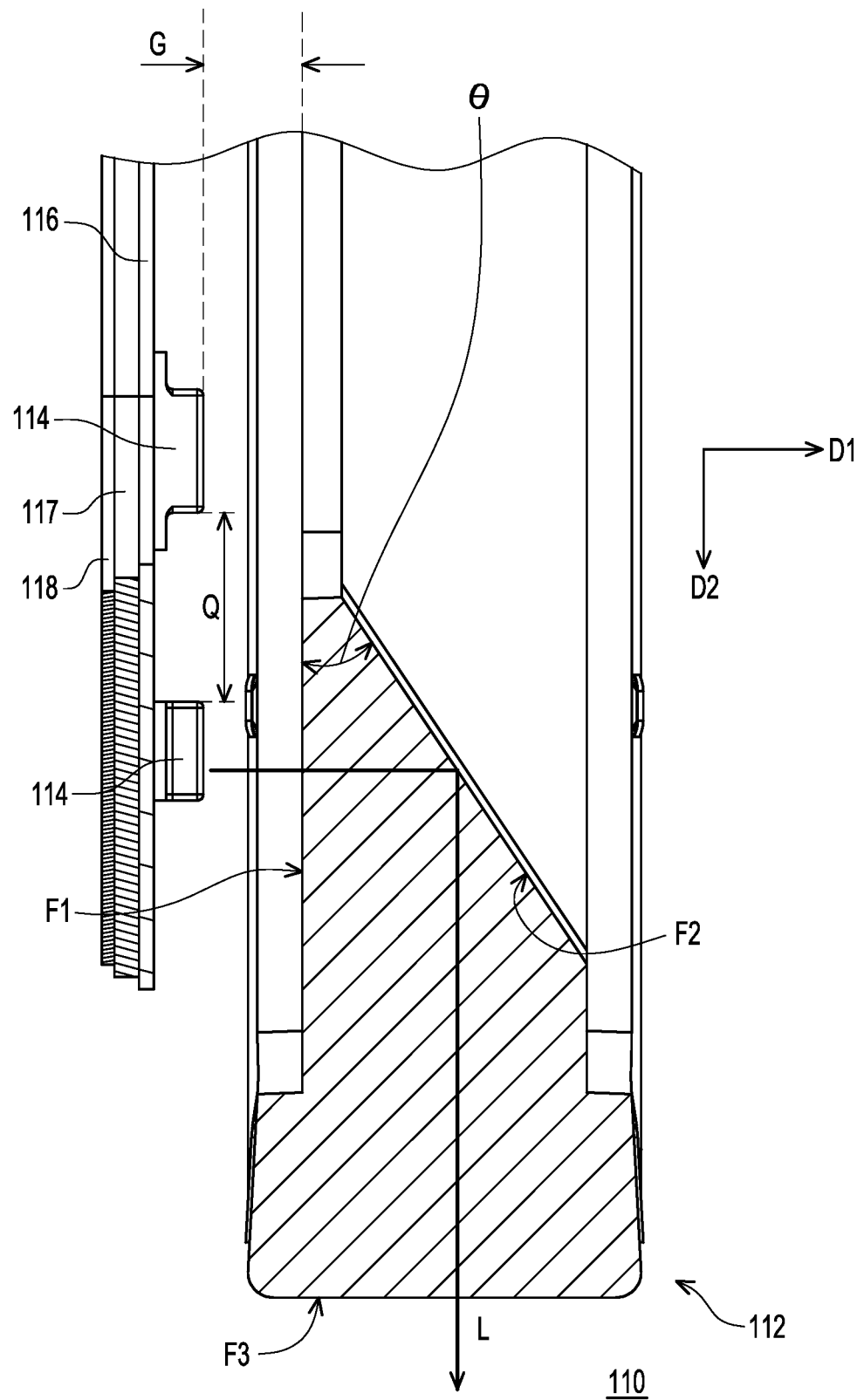
FIG. 3 is a partial cross-sectional schematic view of the state indication light of FIG. 2B along a line I-I.

FIG. 2A is a perspective view of some components of the state indication light in FIG. 1A. FIG. 2B is another perspective view of some components of the state indication light in FIG. 2A. FIG. 3 is a partial cross-sectional schematic view of the state indication light of FIG. 2B along a line I-I. Referring to FIGS. 2A to 3, specifically, the state indication light 110 includes a light-guiding structure 112 and multiple light-emitting elements 114. The light-guiding structure 112 has an incident plane F1 (FIG. 2B), a reflection plane F2 and an exit plane F3. The reflection plane F2 is inclined to the incident plane F1 and the exit plane F3. The light-emitting elements 114 are, for example, light-emitting diodes, which are disposed on a side of the light-guiding structure 112 and face the incident plane F1. A light beam L (FIG. 3) emitted by each of the light-emitting elements 114 is adapted to enter the light-guiding structure 112 from the incident plane F1 and arrive at the reflection plane F2. The reflection plane F2 is adapted to reflect the light beam L towards the exit plane F3 so that the light beam L is directed from the exit plane F3 to an outside of the light-guiding structure 112. In this way, a user may know the use state of the electronic device 10 from the light emitted by the state indication light 110.

Under the above configuration, the light beam L emitted by each of the light-emitting elements 114 does not directly illuminate the exit plane F3, thereby avoiding the phenomenon of light segmentation on the exit plane F3. Moreover, as long as the extension range of the incident plane F1 and the reflection plane F2 is large enough, the number and arrangement range of the light-emitting elements 114 may be sufficient to cover the range of the exit plane F3 without causing the brightness to be concentrated merely in a local area of the exit plane F3. Therefore, the electronic device 10 of the embodiment may achieve the effect of uniform lighting of the state indication light 110.

Furthermore, as shown in FIGS. 2A and 2B, the light-guiding structure 112 of the embodiment is in an L shape, and the incident plane F1, the reflection plane F2 and the exit plane F3 disposed on the light-guiding structure 112 are also in an L shape. The incident plane F1, the reflection plane F2 and the exit plane F3 extend in the same direction, and the dimensions of the incident plane F1, the reflection plane F2 and the exit plane F3 in the extending direction are also substantially the same. In other words, the extension ranges of the incident plane F1, the reflection plane F2 and the exit plane F3 correspond to each other so that the light beam L entering from the incident plane F1 evenly covers the range of the exit plane F3, which avoids uneven lighting or insufficient brightness of the L-shaped light-guide structure 112 at the corner. In addition, spacing Q exists between two adjacent light-emitting elements 114 (FIG. 3). The specific spacing Q may enable the light beam L emitted by the light-emitting element 114 to evenly illuminate the exit plane F3, so as to achieve the effect of uniform light emission from the light-guiding structure 112. Conversely, if the spacing Q is too large, the exit plane F3 has problems of light segmentation and insufficient brightness. If the spacing Q is too small, the number of light-emitting elements 114 needs to be increased, resulting in increased production costs.

The incident plane F1, the reflection plane F2 and the exit plane F3 will be described in detail below. First, the incident plane F1 of the embodiment is, for example, a highly polished plane. The projection of each of the light-emitting elements 114 on the incident plane F1 is evenly distributed on the incident plane F1, so that the light beam L emitted by the light-emitting element 114 evenly illuminates the incident plane F1. Spacing G (FIG. 3) exists between each of the light-emitting elements 114 and the incident plane F1 to prevent the light-guiding structure 112 from being excessively heated and causing deterioration or deformation.

As shown in FIG. 3, the reflection plane F2 and the incident plane F1 are respectively located on opposite sides of the light-guiding structure 112. The reflection plane F2 overlaps the incident plane F1 in a direction D1 perpendicular to the incident plane F1, and may completely reflect the light beam L entering the light-guiding structure 112 from the incident plane F1 to the exit plane F3. The illumination range of the light-emitting element 114 is, for example, 120 degrees. Under this premise, an included angle θ between the reflection plane F2 and the incident plane F1 needs to be less than 45 degrees to achieve a good and uniform light-emitting effect.

If the included angle θ is greater than 45 degrees, the dimension of the reflection plane F2 is reduced, resulting in a reduction in the amount of reflected light. Moreover, the reflection plane F2 may be too close to the light-emitting element 114, thereby affecting the light-emitting effect. In addition, if the included angle θ between the reflection plane F2 and the incident plane F1 is arbitrarily changed, the light beam L reflected towards the exit plane F3 may be biased to a side of the exit plane F3, resulting in a decrease in the overall illumination uniformity of the exit plane F3.

The state indication light 110 of the embodiment may further include a reflective layer. The reflective layer is disposed on the reflection plane F2 by coating, for example, so that the reflection plane F2 has the effect of reflecting a light beam. Of course, the reflection plane F2 may also be mirror-polished to achieve the effect of reflecting a light beam, and the reflection mechanism of the reflection plane F2 is not limited thereto.

The exit plane F3 is an appearance surface of the light-guiding structure 112 and overlaps the reflection plane F2 in a direction D2 parallel to the incident plane F1, thereby ensuring that the light beam L reflected by the reflection plane F2 may completely reach the exit plane F3. The exit plane F3 has an etching pattern, which may make the brightness of the exit plane F3 more uniform and prevent the internal components of the electronic device 10 (FIG. 1A) from being seen through the exit plane F3 to maintain the aesthetic of the electronic device 10. In addition, the exit plane F3 and the main functional area M (FIG. 1A) are located on different sides of the housing 100. That is, the light emitted from the exit plane F3 is used as the light source of the state indication light 110 and is not used in the main functional area M. In addition, if the light-emitting element 114 is close to the exit plane F3, although the brightness of the exit plane F3 can be improved, the exit plane F3 also tends to appear grainy, resulting in a decrease in the light-emitting uniformity of the exit plane F3.

Next, the specific structure of the light-guiding structure 112 will be described. As shown in FIG. 2A, the light-guiding structure 112 of the embodiment includes a main body portion 1121 and an extension portion 1122. The incident plane F1 and the reflection plane F2 are located on the main body portion 1121, and the exit plane F3 is located on the extension portion 1122. The extension portion 1122 extends from the main body portion 1121 towards an outside of the electronic device 10 (FIG. 1A), and does not overlap the light-emitting element 114 in the direction D1 perpendicular to the incident plane F1. In this way, a certain distance is maintained between the reflection plane F2 and the exit plane F3, which facilitates improvement in the light-emitting uniformity of the exit plane F3. In addition, the light-guiding structure 112 is light-transmissive, and may further be doped with titanium dioxide particles, light guide powder or diffusion powder to achieve different light guide and visual effects.

Figure 4:
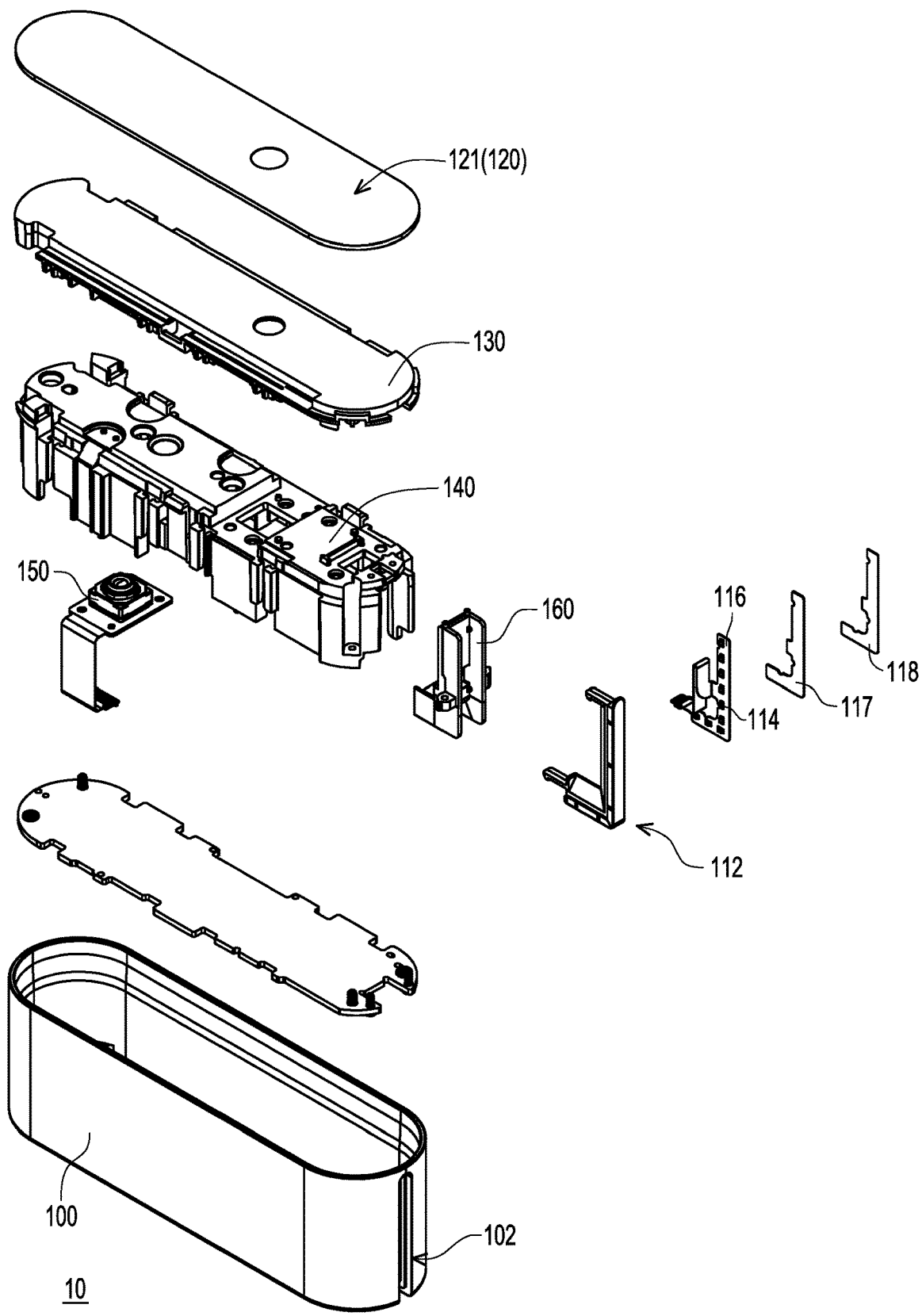
FIG. 4 is an exploded view of the electronic device of FIG. 1A.
Figure 5:
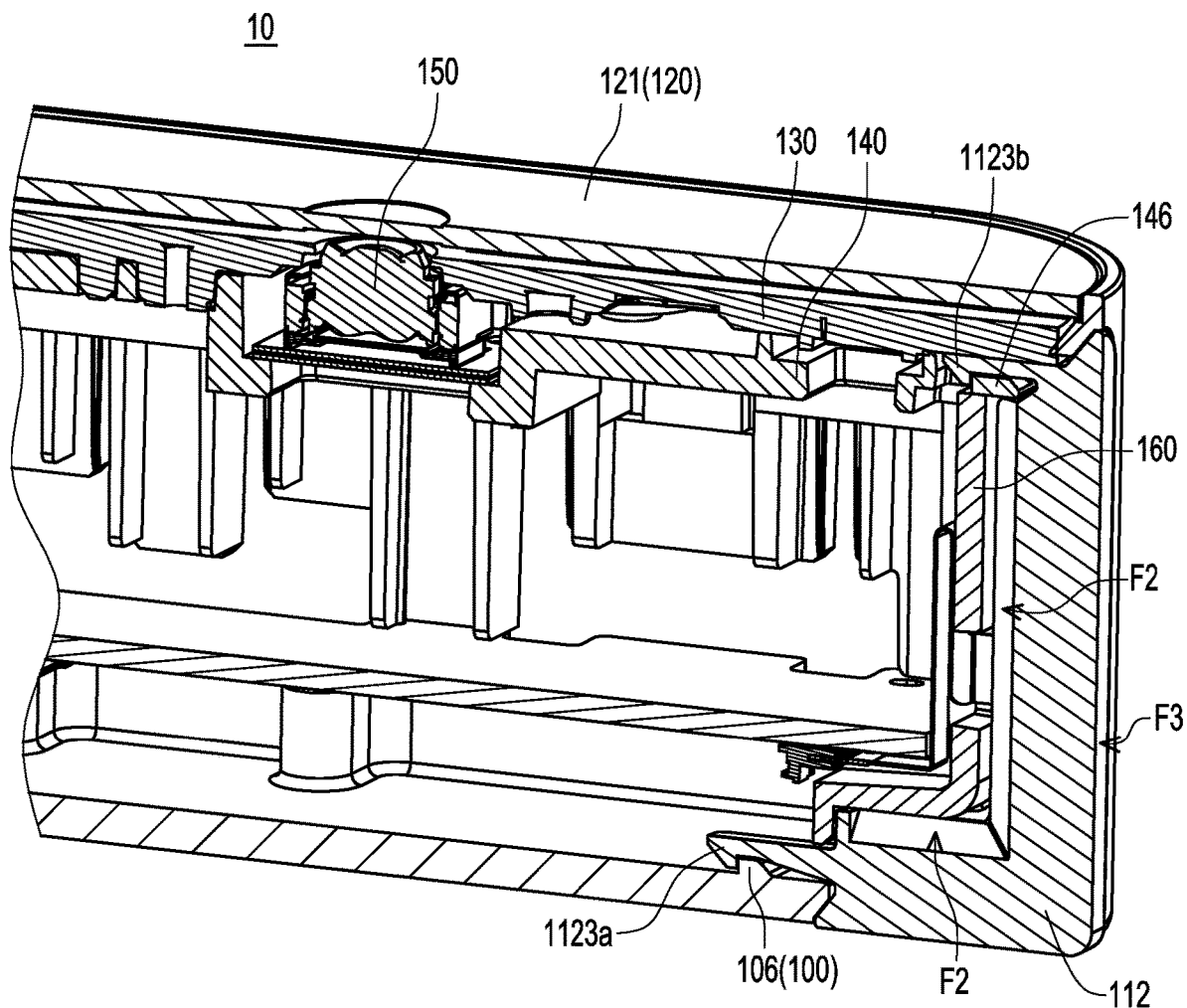
FIG. 5 is a schematic cross-sectional view of the electronic device of FIG. 1A.

FIG. 4 is an exploded view of the electronic device of FIG. 1A. FIG. 5 is a schematic cross-sectional view of the electronic device of FIG. 1A. Referring to FIGS. 2A, 4 and 5, the light-guiding structure 112 of the embodiment further includes at least one hook portion 1123a or hook portion 1123b (two are shown). The hook portion 1123a and the hook portion 1123b are integrally formed and connected to the main body portion 1121, but the hook portion 1123a, the hook portion 1123b and the main body portion 1121 may also be different components. As shown in FIG. 5, the hook portion 1123a is engaged with a convex lump 106 of the housing 100, and the hook portion 1123b is engaged with a convex lump 146 of a support structure 140 in the housing 100 to engage with and fix the light-guiding structure 112 to the housing 100, but the fixing method of the light-guiding structure 112 is not limited thereto.

It should be noted that the light-guiding structure 112 of the embodiment is adapted for assembly to the housing 100 from an outside of the housing 100. The exit plane F3 (i.e., the appearance surface of the light-guiding structure 112) is flush with an appearance surface of the housing 100, so that the appearance of the electronic device 10 may be kept smooth. Since the light-guiding structure 112 is fixed to the housing 100 through the hook portion 1123a and the hook portion 1123b, it is not needed to use locking accessories such as screws to fix the light-guiding structure 112 to the housing 100, thus the appearance aesthetics of the electronic device 10 may be improved. In addition, if the light-guiding structure 112 is assembled to the housing 100 from an inside of the housing 100, the required structure is complicated and the assembly is not easy. Therefore, the assembly of the light-guiding structure 112 from the outside of the housing 100 actually facilitates the reduction in the assembly time and costs.

Figure 6:
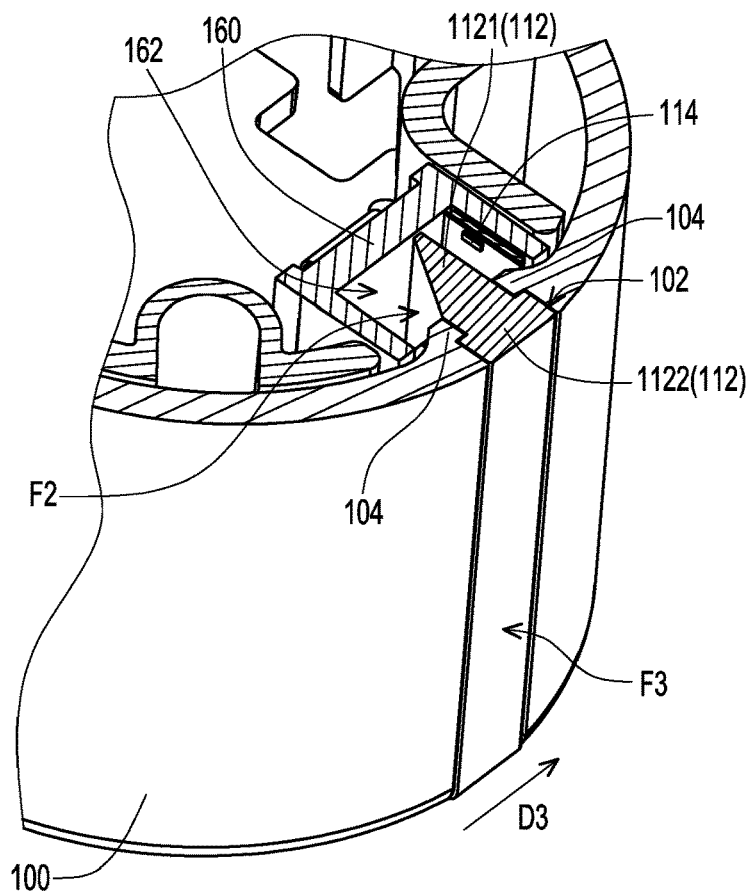
FIG. 6 is another cross-sectional schematic view of the electronic device of FIG. 1A.

FIG. 6 is another cross-sectional schematic view of the electronic device of FIG. 1A. In order to clearly show the interior of the housing, the support structure of FIG. 6 is hidden. Referring to FIG. 6, the housing 100 has a slot 102, and a protruding portion 104 is disposed inside the slot 102. On the other hand, the extension portion 1122 of the light-guiding structure 112 protrudes relative to the main body portion 1121 in a direction D3 parallel to the exit plane F3. When the light-guiding structure 112 is assembled to the housing 100, at least a part of the main body portion 1121 passes through the slot 102 and extends into the inside of the housing 100. The protruding portion 104 blocks the extension portion 1122 in the slot 102 and may block the light beam L (FIG. 3) emitted by the light-emitting element 114 to prevent the light beam L from leaking to the outside of the housing 100 before entering the light-guiding structure 112.

Figure 7:
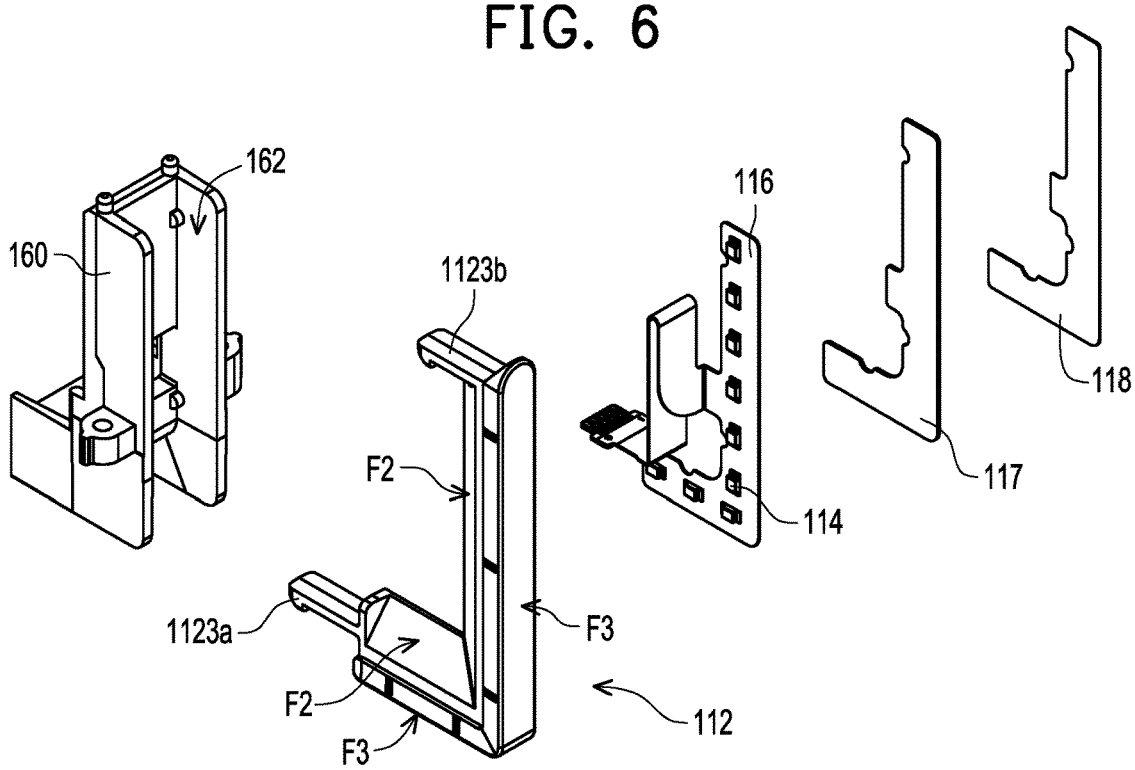
FIG. 7 is an enlarged schematic diagram of the state indication light and a frame body of FIG. 4.

FIG. 7 is an enlarged schematic diagram of the state indication light 110 and a frame body 160 of FIG. 4. Referring to FIGS. 4, 5 and 7, the electronic device 10 of the embodiment further includes an upper cover body 120, an inner cover body 130, a lens 150 and a frame body 160. An upper surface 121 of the upper cover body 120 is an appearance surface of the electronic device 10. The upper cover body 120 is disposed on the inner cover body 130. However, the upper cover body 120 and the inner cover body 130 may also be integrally formed. The inner cover body 130 is disposed on the support structure 140 and can block the light beam L (FIG. 3) emitted by the light-emitting element 114 to prevent the light beam L from leaking to the outside of the upper cover body 120. The lens 150 is disposed on the support structure 140 and configured to capture an external image.

The frame body 160 is disposed on a side of the support structure 140 and is located between the light-emitting element 114 and the lens 150. The light-guiding structure 112 and the light-emitting element 114 are disposed on the frame body 160. In detail, as shown in FIG. 7, the frame body 160 may define a recess portion 162. The light-guiding structure 112 and the light-emitting element 114 are located in the recess portion 162. The recess portion 162 and the lens 150 are respectively located on opposite sides of the frame body 160. In this way, the frame body 160 may block the light beam L emitted by the light-emitting element 114 to avoid interfering with the operation of the lens 150. In addition, the material of the frame body 160 is, for example, plastic, but the material of the frame body 160 may also be metal to improve the heat dissipation effect. The disclosure does not limit the material of the frame body 160.

As shown in FIG. 7, the state indication light 110 further includes a flexible circuit board 116, a reinforcement board 117 and a bonding layer 118. The light-emitting element 114 is disposed on the flexible circuit board 116, and the flexible circuit board 116 is stacked on the reinforcement board 117. The reinforcement board 117 is made of, for example, aluminum or steel to support the flexible circuit board 116 and improve the heat dissipation effect. The bonding layer 118 is disposed on the reinforcement board 117, and the reinforcement board 117 is located between the flexible circuit board 116 and the bonding layer 118. The bonding layer 118 is, for example, thermally conductive double-sided tape or thermally conductive adhesive to fix the flexible circuit board 116 to the frame body 160 and also has a heat dissipation effect.

To sum up, the light-emitting element of the state indication light of the disclosure is disposed on a side of the light-guiding structure corresponding to the incident plane of the light-guiding structure, so that the light beam emitted by the light-emitting element enters the light-guiding structure from the incident plane of the light-guiding structure and arrives at the inclined reflection plane, thereby being reflected by the reflection plane towards the exit plane, and directed from the exit plane to the outside of the light-guiding structure. In this way, the light beam emitted by each of the light-emitting elements does not directly illuminate the exit plane, thereby avoiding the phenomenon of light segmentation on the exit plane. Moreover, under the configuration of the disclosure, as long as the extension range of the incident plane and the reflection plane is large enough, the number and arrangement range of the light-emitting elements may be sufficient to cover the range of the exit plane without causing the brightness to be concentrated merely in a local area of the exit plane. Therefore, the electronic device of the disclosure may achieve the effect of uniform lighting of the state indication light.

Although the disclosure has been described with reference to the above embodiments, the described embodiments are not intended to limit the disclosure. People of ordinary skill in the art may make some changes and modifications without departing from the spirit and the scope of the disclosure. Thus, the scope of the disclosure shall be subject to those defined by the attached claims.

What is claimed is:
1. An electronic device, comprising:
 a housing; and
 a state indication light, assembled to the housing and comprising
  a light-guiding structure, having a main body portion and an extension portion extending from the main body portion, wherein an incident plane and a reflection plane are located on the main body portion, an exit plane is located on the extension portion, and the reflection plane is inclined to the incident plane and the exit plane; and
  a plurality of light-emitting elements, disposed on a side of the light-guiding structure and facing the incident plane, wherein a light beam emitted by each of the light-emitting elements is adapted to enter the light-guiding structure from the incident plane and arrives at the reflection plane, and the reflection plane is adapted to reflect the light beam towards the exit plane so that the light beam is transmitted within the light-guiding structure and is directed from the exit plane to an outside of the light-guiding structure.

2. The electronic device according to claim 1, wherein spacing exists between each of the light-emitting elements and the incident plane.

3. The electronic device according to claim 1, wherein the light-guiding structure is in an L shape.

4. The electronic device according to claim 1, wherein the reflection plane overlaps the incident plane in a direction perpendicular to the incident plane.

5. The electronic device according to claim 1, wherein an included angle between the reflection plane and the incident plane is less than 45 degrees.

6. The electronic device according to claim 1, wherein the light-guiding structure is adapted to be assembled to the housing from an outside of the housing, and the exit plane is flush with an appearance surface of the housing.

7. The electronic device according to claim 1, wherein an appearance surface of the light-guiding structure is the exit plane, and the exit plane has an etching pattern.

8. The electronic device according to claim 1, wherein the extension portion extends from the main body portion towards an outside of the electronic device.

9. The electronic device according to claim 1, wherein the extension portion does not overlap the light-emitting elements in a direction perpendicular to the incident plane.

10. The electronic device according to claim 1, wherein the extension portion protrudes relative to the main body portion in a direction parallel to the exit plane.

11. The electronic device according to claim 1, wherein the light-guiding structure comprises at least one hook portion that are connected to each other, and the at least one hook portion is engaged with the housing.

12. The electronic device according to claim 11, wherein the at least one hook portion is integrally formed and connected to the main body portion.

13. The electronic device according to claim 1, wherein the light-guiding structure is doped with titanium dioxide particles.

14. The electronic device according to claim 1, wherein the state indication light further comprises a frame body, and the light-guiding structure and the light-emitting elements are disposed on the frame body.

15. The electronic device according to claim 14, wherein the electronic device is a camera device and further comprises a lens, and the frame body is located between the light-emitting elements and the lens.

16. The electronic device according to claim 15, wherein the frame body defines a recess portion, the light-guiding structure and the light-emitting elements are located in the recess portion, and the recess portion and the lens are located on opposite sides of the frame body.

17. The electronic device according to claim 1, wherein the state indication light further comprises a flexible circuit board and a reinforcement board, the light-emitting elements are disposed on the flexible circuit board, and the flexible circuit board is stacked on the reinforcement board.

18. The electronic device according to claim 1, wherein the state indication light further comprises a reflective layer, and the reflective layer is disposed on the reflection plane.

19. The electronic device according to claim 1, wherein the electronic device has a main functional area, and the main functional area and the exit plane are respectively located on different sides of the housing.

20. The electronic device according to claim 19, wherein the electronic device is a camera device, and the main functional area is a camera area.

* * * * *